(12) United States Patent
Kim

(10) Patent No.: US 6,929,888 B2
(45) Date of Patent: Aug. 16, 2005

(54) PHOTOMASK AND EXPOSURE METHOD FOR LARGE SCALED LCD DEVICE

(75) Inventor: Jung-Young Kim, Pusan (KR)

(73) Assignee: LG.Philips LCD Co., Ltd., Seoul (KR)

( * ) Notice: Subject to any disclaimer, the term of this patent is extended or adjusted under 35 U.S.C. 154(b) by 249 days.

(21) Appl. No.: 10/455,412

(22) Filed: Jun. 6, 2003

(65) Prior Publication Data

US 2003/0211404 A1 Nov. 13, 2003

Related U.S. Application Data

(62) Division of application No. 09/784,092, filed on Feb. 16, 2001, now Pat. No. 6,576,378.

(30) Foreign Application Priority Data

Feb. 17, 2000 (KR) .......................................... 2000-7614

(51) Int. Cl.[7] ................................................ G01F 9/00
(52) U.S. Cl. ............................................. 430/5; 430/22
(58) Field of Search ...................... 430/5, 22; 257/797; 438/5, 975

(56) References Cited

U.S. PATENT DOCUMENTS

| | | | | | |
|---|---|---|---|---|---|
| 5,017,514 A | * | 5/1991 | Nishimoto | ................... | 437/229 |
| 5,407,763 A | * | 4/1995 | Pai | ................................. | 430/5 |
| 5,580,829 A | * | 12/1996 | Browning et al. | .......... | 437/226 |
| 6,281,024 B1 | * | 8/2001 | Yoshitake | ...................... | 438/8 |

* cited by examiner

*Primary Examiner*—S. Rosasco
(74) *Attorney, Agent, or Firm*—McKenna Long & Aldridge LLP

(57) ABSTRACT

A photolithography process and its enabling photomask that is suitable for fabricating large substrates. The photomask is comprised of a transparent substrate, a pattern on that transparent substrate, a plurality of main mask keys on side edges of the transparent substrate, and a plurality of auxiliary mask keys, each spaced apart from a corresponding main mask key. To expose a substrate, the photomask is sequentially aligned with plate keys on the substrate using the main mask keys and then the auxiliary mask keys. Alternatively, the substrate includes a plurality of main plate keys and auxiliary plate keys and the photomask includes a plurality of mask keys. To expose the substrate, the photomask is sequentially aligned with the main plate keys and then the auxiliary plate keys by using the mask keys.

3 Claims, 8 Drawing Sheets

PHOTOMASK AND EXPOSURE METHOD FOR LARGE SCALED LCD DEVICE

This application is a divisional of U.S. patent application Ser. No. 09/784,092 filed Feb. 16, 2001 now U.S. Pat. No. 6,576,378.

This application claims the benefit of Korean Patent Application No. 2000-7614, filed on Feb. 17, 2000, which is hereby incorporated by reference.

BACKGROUND OF THE INVENTION

1. Field of the Invention

The present invention relates to a photomask and to an exposure method that uses that photomask. More particularly, the present invention relates to a photomask and to an exposure method that are suitable for fabricating large liquid crystal display devices.

2. Discussion of the Related Art

Generally, a liquid crystal display (LCD) device includes upper and lower substrates. The lower substrate includes switching devices and array lines, while the upper substrate includes a color filter. The upper and lower substrates are spaced apart from each other and a liquid crystal layer is interposed therebetween.

The lower substrate is often called an array substrate. It includes a plurality of pixel regions. Each pixel region is defined by crossing data lines and gate lines. A pixel electrode is disposed in the pixel region. At each data line/gate line crossing is a thin film transistor (TFT). Each TFT includes a gate electrode, a source electrode, a drain electrode, and an active layer. The gate and source electrodes electrically connect to the gate and data lines, respectively.

The above-mentioned elements are formed via a plurality of repeated production processes, including depositing, photolithography, and etching. Specifically, the photolithography process includes steps of: (1) coating a photoresist, (2) pre-heat treatment (pre-baking) of the photoresist, (3) exposure of the photoresist, (4) post exposure treatment (post baking), and (5) development. To form a desired photoresist pattern, a photomask is aligned with a photoresist-bearing substrate before exposure. Thereafter, desired portions of the photoresist layer are exposed to light.

A photomask aligning apparatus, for example, a scanner type Canon™ aligner model number MPA 5000, is conventionally used to align the photomask on the substrate. Only after each of the various photomasks is correctly aligned with the substrate is the desired photomask pattern successfully formed. Therefore, a plurality of first and second alignment keys are respectively formed on the photomask and on the substrate to precisely detect the relative position between the substrate and each of the photomasks. The first alignment keys, formed on the substrate, are called plate keys, while the second alignment keys in the photomask are called mask keys. Whether the photomask and the substrate are precisely aligned is determined by sensing the relationship between the mask keys and the plate keys.

A photomask typically includes a transparent substrate (beneficially quartz or glass) onto which either an emulsion thin film (an emulsion mask) or a chromium and chromium oxide thin film (a hard mask) are coated. In either event the photomask carries a desired photomask pattern, which includes the mask keys. The plate keys are formed on the substrate by a first photomask. Once the plate keys are formed, the other photomasks are aligned with respect to the plate key. Proper use of the alignment keys prevents misalignments between the substrate and the photomasks.

FIG. 1 is a plan view of a conventional photomask 17. As shown, a plurality of mask keys M1, M2, and M3 are formed on the photomask 17. The photomask 17 is designed in accord with the requirements of the Canon™ aligner. As shown, the photomask 17 has an overall width of 390 mm and a height of 610 mm (390×610). Additionally, the photomask 17 has a maximum exposure area of 330×560 mm². However, a LCD device greater than 20-inches requires an exposure pattern greater than the 330×560 mm² maximum of the conventional photomask 17. Therefore, the photomask 17 and the Caion™ aligner system are difficult to use when exposing an array substrate for a LCD device greater than 20-inches.

FIG. 2 illustrates the above-mentioned problem. For convenience, only first and second sub-areas 20a and 20b of a substrate 20 that is being patterned are shown. The substrate 20 is exposed to light, beneficially using a step-and-repeat exposure technology that is explained subsequently. After exposure, a non-exposed portion "A" results because of the limited exposure area (330 mm×560 mm) of the conventional photomask 17.

FIG. 3 illustrates a conventional step-and-repeat exposure technique using the conventional photomask. As shown, a large array substrate 31 is divided into a plurality of sub-areas. Each sub-area has plate keys P1, P2, and P3 along its side edges. Though not shown in FIG. 3, it should be understood that a photoresist layer is coated on the array substrate 31. As explained previously, the plate keys P1, P2, and P3 are formed using a first photomask (not shown). At first, a desired photomask (see FIG. 1) is aligned on a first sub-area "P" such that the mask keys (reference M1, M2, and M3 of FIG. 1) correspond to the plate keys P1, P2, and P3. At this point, first and second mask blades 33 and 35 cover the other sub-areas. When the alignment between the mask keys and the plate keys is correct, light is incident on the array substrate 31 such that only the first sub-area "P" is exposed to light through the desired photomask.

After the first sub-area P is fully exposed, the photomask and blades 33 and 35 are moved to a second sub-area. When the alignment between the mask keys and the plate keys is correct, the second sub-area is exposed to light through the photomask. All the sub-areas P are sequentially exposed using the same method. This process is the basis of the step-and-repeat exposure technology.

However, due to the problem explained in FIG. 2, the conventional step-and-repeat technology using the conventional Canon™ aligner system cannot be used for LCD devices greater than 20 inches.

SUMMARY OF THE INVENTION

Accordingly, the present invention is directed to a photomask that substantially obviates one or more of the problems due to limitations and disadvantages of the related art.

An object of the present invention is to provide a photomask that is adaptable for exposing a large LCD device.

In order to achieve the above object, the principles of the present invention provide for a photomask suitable for use in exposing a large substrate. The photomask includes: a transparent substrate, a pattern on the transparent substrate, a plurality of main mask keys on side edges of the transparent substrate; and a plurality of auxiliary mask keys on the side edges of the transparent substrate, with each auxiliary mask key being spaced apart from a corresponding main mask key.

The mask keys include first, second, and third couples of alignment keys on opposite sides of the pattern. The transparent substrate is beneficially quartz or glass. The pattern is formed from an emulsion thin film (an emulsion mask) or a chromium and chromium oxide thin film (a hard mask). The photomask beneficially has a size of 670 mm×590 mm. Each auxiliary mask key is beneficially spaced apart from its corresponding main mask key by 20 mm.

In another aspect, the principles of the present invention provide for a photolithography system for exposing a substrate through a photomask. The system includes: a substrate having a plurality of plate keys, and a photomask having a pattern on a transparent substrate. The photomask includes a plurality of main mask keys and a plurality of auxiliary mask keys, with each auxiliary mask key being spaced apart from a corresponding main mask key. The photomask is aligned with the substrate using the plate keys and the main and auxiliary mask keys.

In another aspect, the principles of the present invention provide for a photolithography exposure method using a prepared substrate and photomask. The photomask including a plurality of main mask keys and auxiliary mask keys, while the substrate includes a plurality of plate keys. The photomask is aligned on the substrate by bring the main mask keys and the plate keys into coincidence, thus covering a first exposing portion of the substrate with the photomask. The first exposing portion is then exposed. The photomask is then re-aligned on the substrate by bring the auxiliary mask keys and the plate keys into coincidence such that a second exposing portion is covered by the photomask. The second exposing portion is then exposed. The method further includes covering the second exposing portion with a blade before exposing the first exposing portion to shield the second portion from the exposing light.

The method also includes covering the first exposing portion with a blade before exposing the second exposing portion such that the first portion is shielded from the exposing light.

Alternatively, the plate keys can be brought into coincidence with the auxiliary mask keys first.

The principles of the present invention further provide for a substrate having a plurality of main plate keys and a plurality of auxiliary plate keys, with each auxiliary plate key being spaced apart from a corresponding main plate key.

The plate keys include first, second, and third couples of alignment keys on opposite sides of a pattern, with the pattern formed to match a mask pattern on a photomask, which beneficially has a size of 670 mm×590 mm. Each auxiliary plate key is beneficially spaced apart from its corresponding main plate key by 20 mm.

In another aspect, the principles of the present invention provide for a photolithography system for exposing a substrate through a photomask. The system includes a substrate having a plurality of main plate keys and a plurality of auxiliary plate keys, with each auxiliary plate key being spaced apart from a corresponding main plate key. The photomask has a pattern on a transparent substrate, including a plurality of mask keys. The substrate is aligned with the photomask using the main and auxiliary plate keys and the mask keys.

In another aspect, the principles of the present invention provide for a photolithography exposure method using a prepared substrate and a photomask. The photomask includes a plurality of mask keys, while the substrate includes a plurality of main plate keys and auxiliary plate keys. The substrate is aligned with the photomask by bring the main plate keys and the mask keys into coincidence, thus covering a first exposing portion of the substrate with the photomask. The first exposing portion is then exposed. The substrate is then re-aligned with the photomask to bring the auxiliary plate keys and the mask keys into coincidence such that a second exposing portion is covered by the photomask. The second exposing portion is then exposed. The method further includes covering the second exposing portion with a blade before exposing the first exposing portion to shield the second portion from the exposing light.

The method also includes covering the first exposing portion with a blade before exposing the second exposing portion such that the first portion is shielded from the exposing light.

Alternatively, the auxiliary plate keys can be brought into coincidence with the mask keys first.

It is to be understood that both the foregoing general description and the following detailed description are exemplary and explanatory and are intended to provide a further explanation of the claimed invention.

BRIEF DESCRIPTION OF THE DRAWING

The accompanying drawings, which are included to provide a further understanding of the invention and are incorporated in and constitute a part of this specification, illustrate an embodiment of the present invention and together with the description serve to explain the principles of that invention.

In the drawings.

DETAILED DESCRIPTION OF THE ILLUSTRATED EMBODIMENT

Reference will now be made in detail to an illustrated embodiment of the present invention, an example of which is shown in the accompanying drawings.

Figure 1:
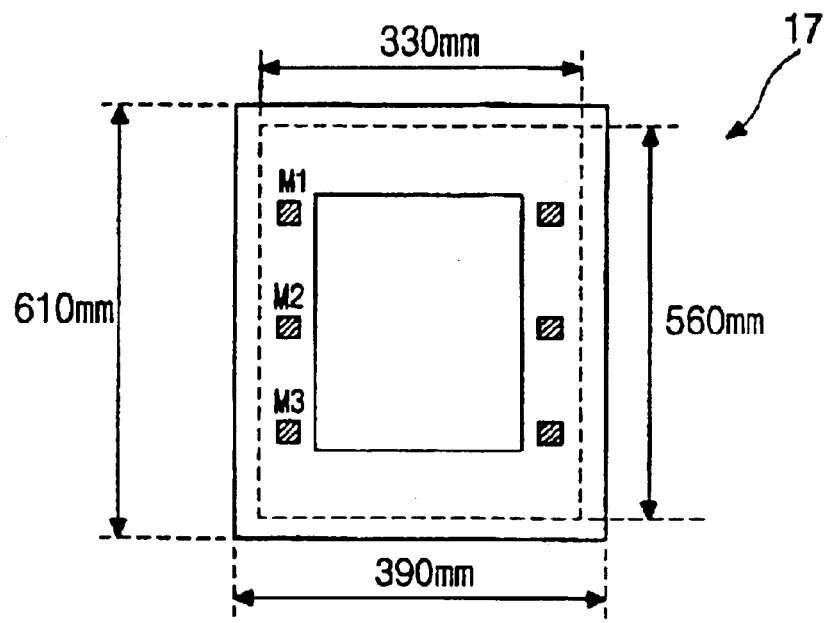
FIG. 1 is a plan view illustrating a photomask according to the related art.
Figure 4:
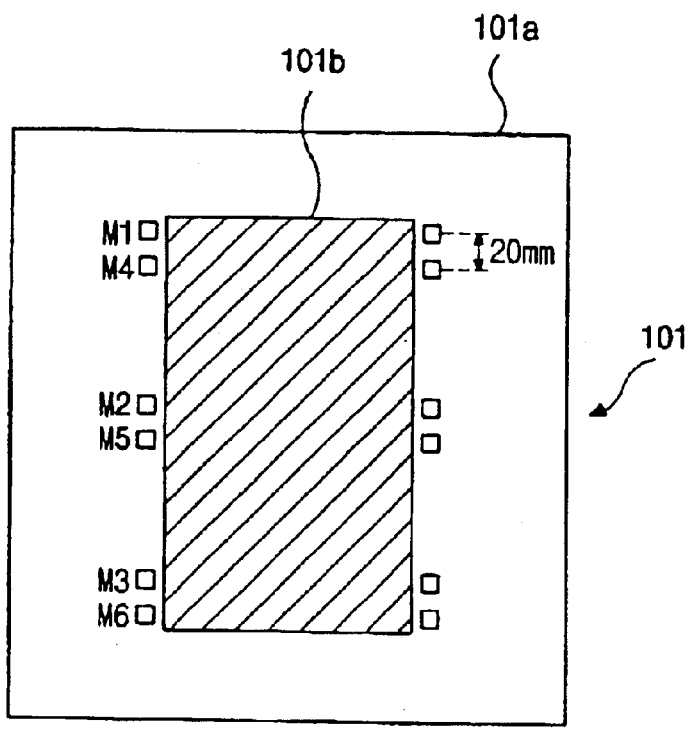
FIG. 4 is a plan view of a photomask according to an embodiment of the present invention.

As shown in FIG. 4, the photomask 101 includes a transparent substrate 101a having a pattern 101b. The transparent substrate 101a is beneficially quartz or glass, and the pattern 101b is beneficially comprised of an emulsion thin film (an emulsion mask) or a chromium and chromium oxide thin film (a hard mask). In addition, sets of first, second, and third main mask keys M1, M2, and M3 are formed on side edges of the photomask 101. Furthermore, 20 mm below each main mask key is an auxiliary mask key. The auxiliary mask keys are designated as first, second, and third auxiliary mask keys M4, M5, and M6. The photomask 101 is beneficially the same size as the conventional photomask 17 shown in FIG. 1.

Figure 2:
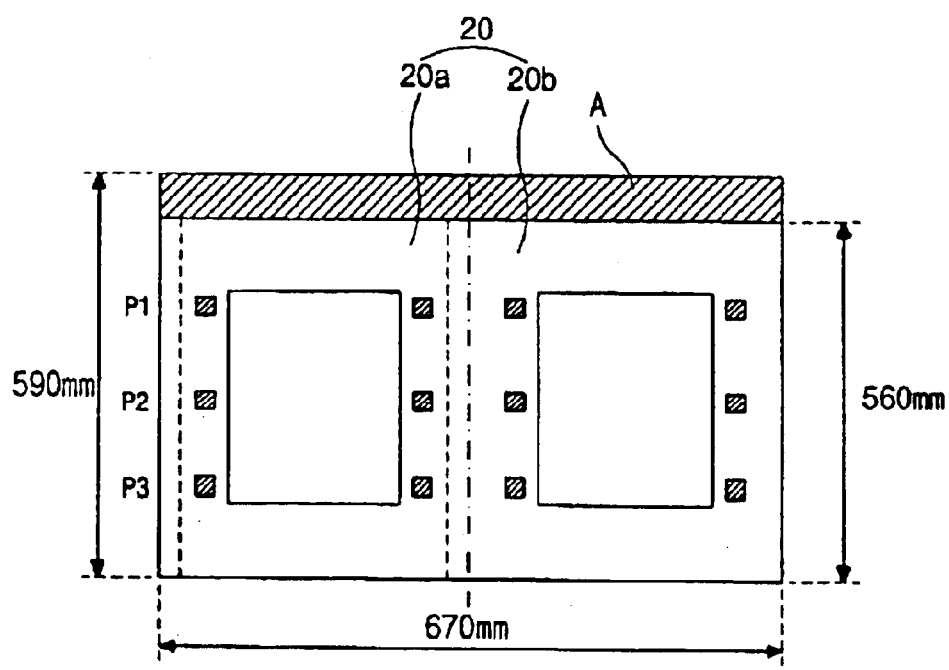
FIG. 2 illustrates the problem of exposing a large substrate using a conventional photomask.
Figure 3:
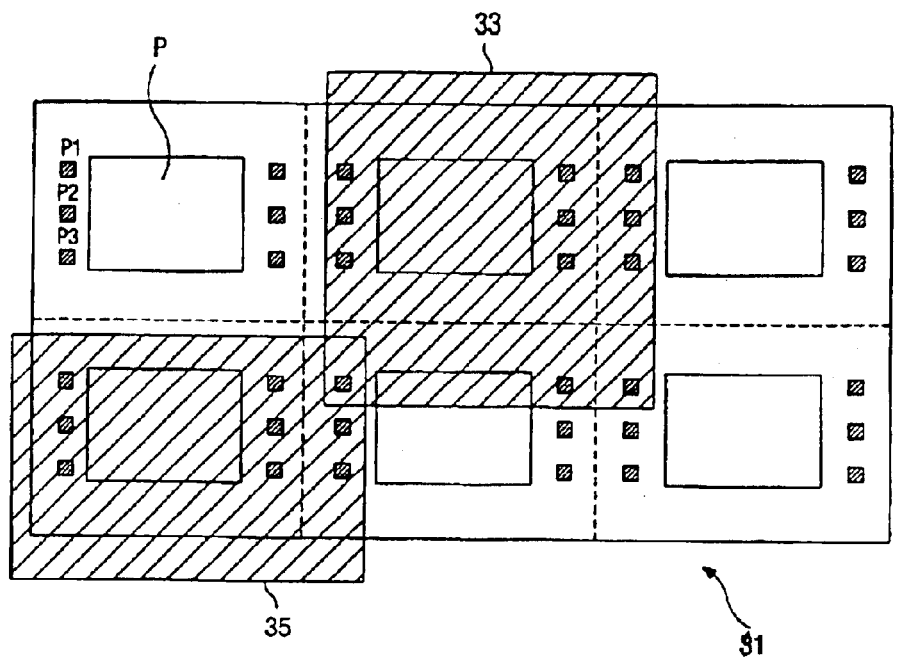
FIG. 3 illustrates the general step-and-repeat exposure technology.

FIGS. 5 to 8 illustrate the exposure sequence of a large substrate (such as for a LCD array) using the photomask 101. In the illustrated process the large substrate 119, which has the same 670 mm×590 mm size as the substrate 20 in FIG. 2, is divided into two sub-areas, a first sub-area 119a and a second sub-area 119b. In turn, as described subsequently, each sub-area is divided into two exposure regions. Thus there are four exposure regions. In addition, first to third main plate keys P1 to P3, and first to third auxiliary plate keys P4 to P6 are formed on side edges of each sub-area. It is to be understood that a photoresist layer is coated on the surface of the substrate 119.

Figure 5A:
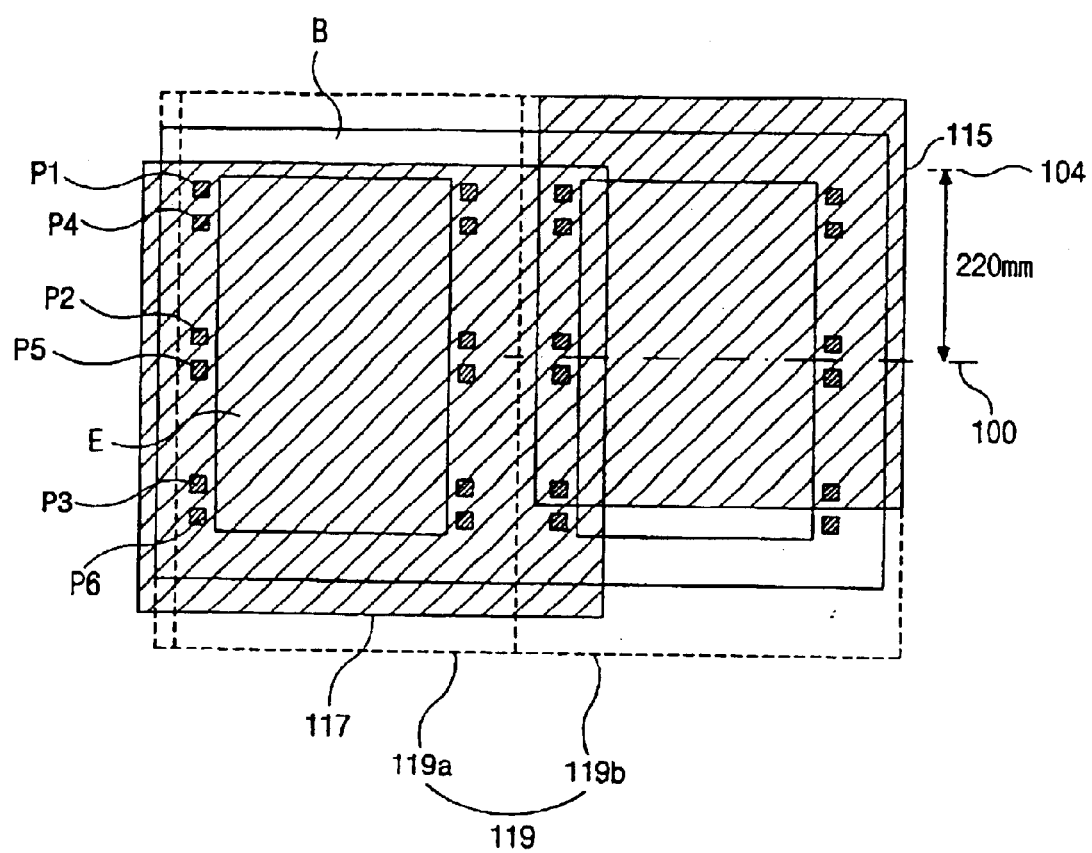
FIGS. 5A and 5B illustrate a first exposure according to the principles of the present invention.
Figure 5B:
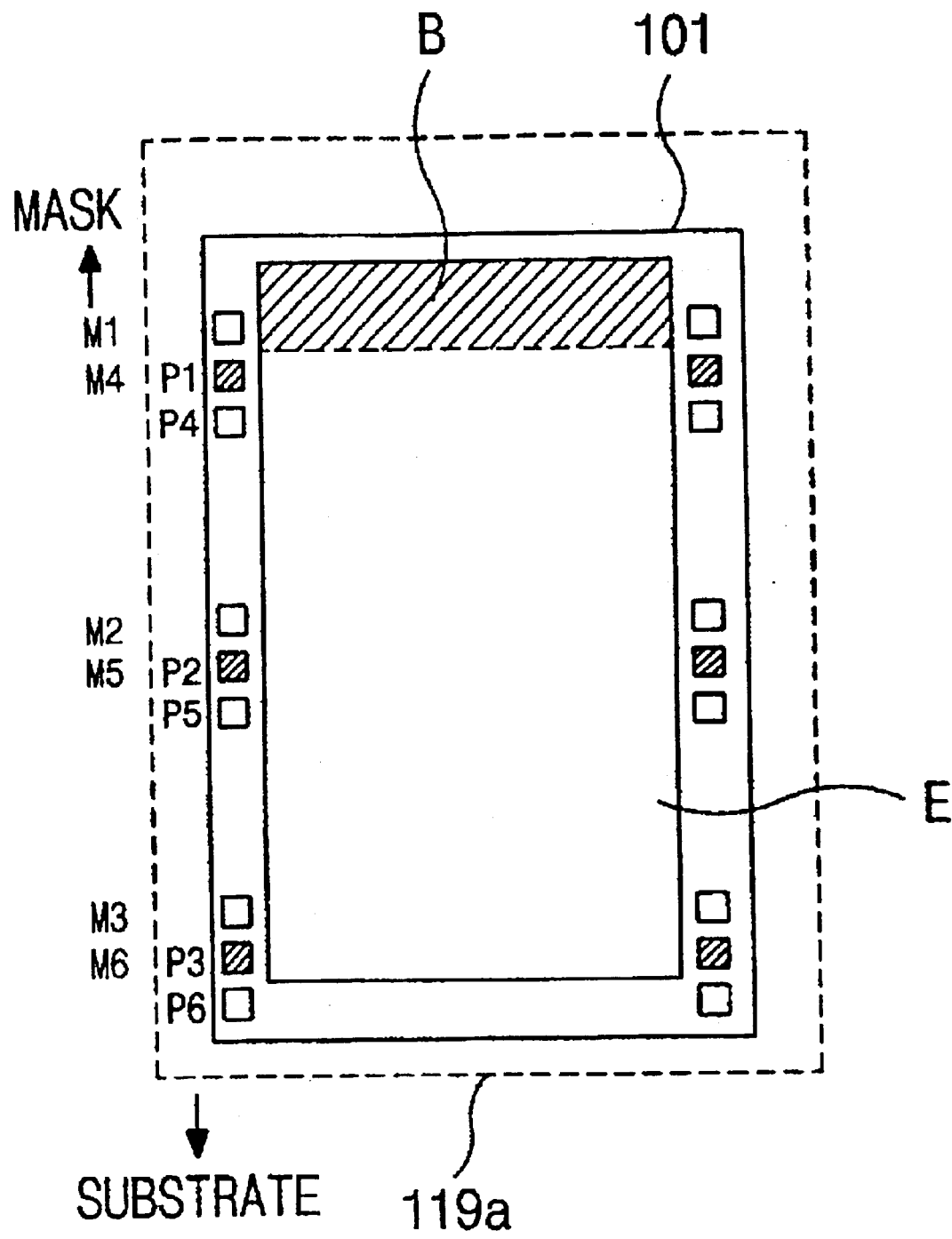

Referring now to FIG. 5B, initially the photo mask 101 (not shown) is aligned with the first sub-area 119a such that a first exposing region "B" is covered by the photomask 101. To ensure that the first exposing region "B" and the photomask 101 are properly aligned, the first to third auxiliary mask keys M4 to M6 are respectively aligned with the first to third main plate keys P1 to P3 of the first sub-area 119a. A third exposing region "E" of the first sub-area 119a, which is the main pattern area of the first sub-area 119a, is exposed subsequently.

Thereafter, as shown in FIG. 5A, first and second blades 115 and 117 are aligned to cover the area around the first exposing region "B" of the first sub-area 119a. Significantly, the first blade 115 covers the area between a centerline 100 and a boundary line 104 of the second sub-area 119b. The boundary line 104 is located 220 mm above the centerline 100. Namely, the boundary line 104 refers to a boundary between the third exposing region "E" and the first exposing region "B". The second blade 117 covers the third exposing portion "E", which is below the first exposing region "B" of the first sub-area 119a. Thus, when light is incident on the first sub-area 119a, only the first exposing region "B" of the first sub-area 119a is exposed to light. The third exposing region "E" (being the main pattern area) and the second sub-area 119b are protected by the first and second blades 115 and 117.

Figure 6A:
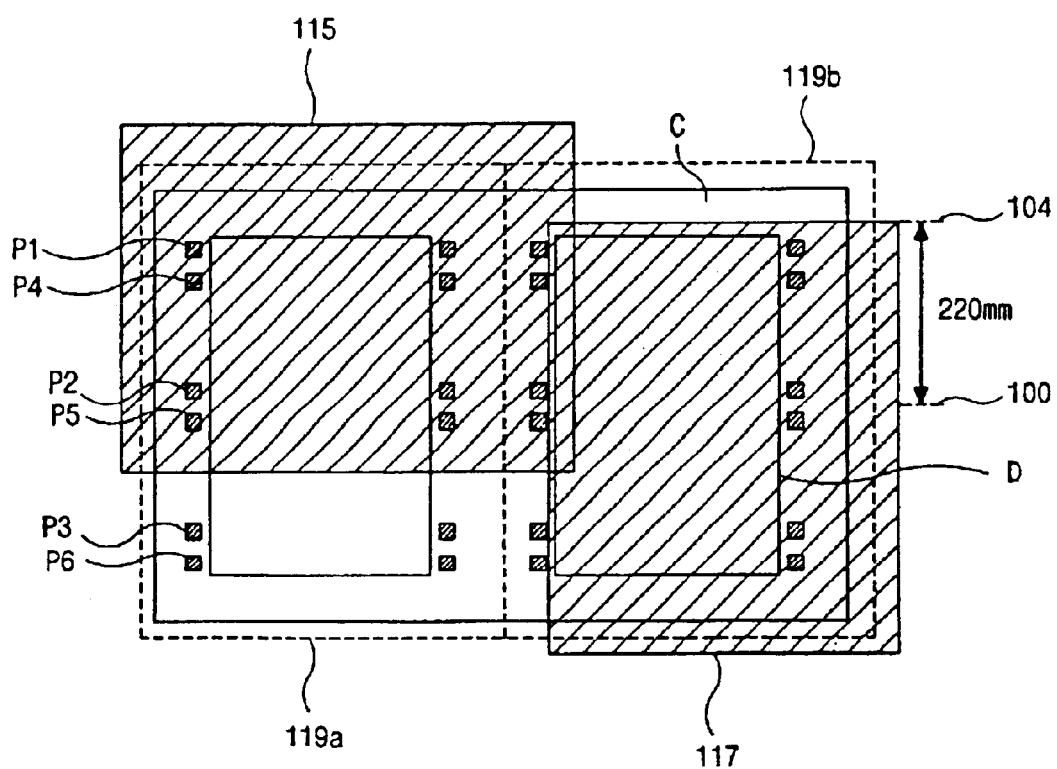
FIGS. 6A and 6B illustrate a second exposure according to the principles of the present invention.
Figure 6B:
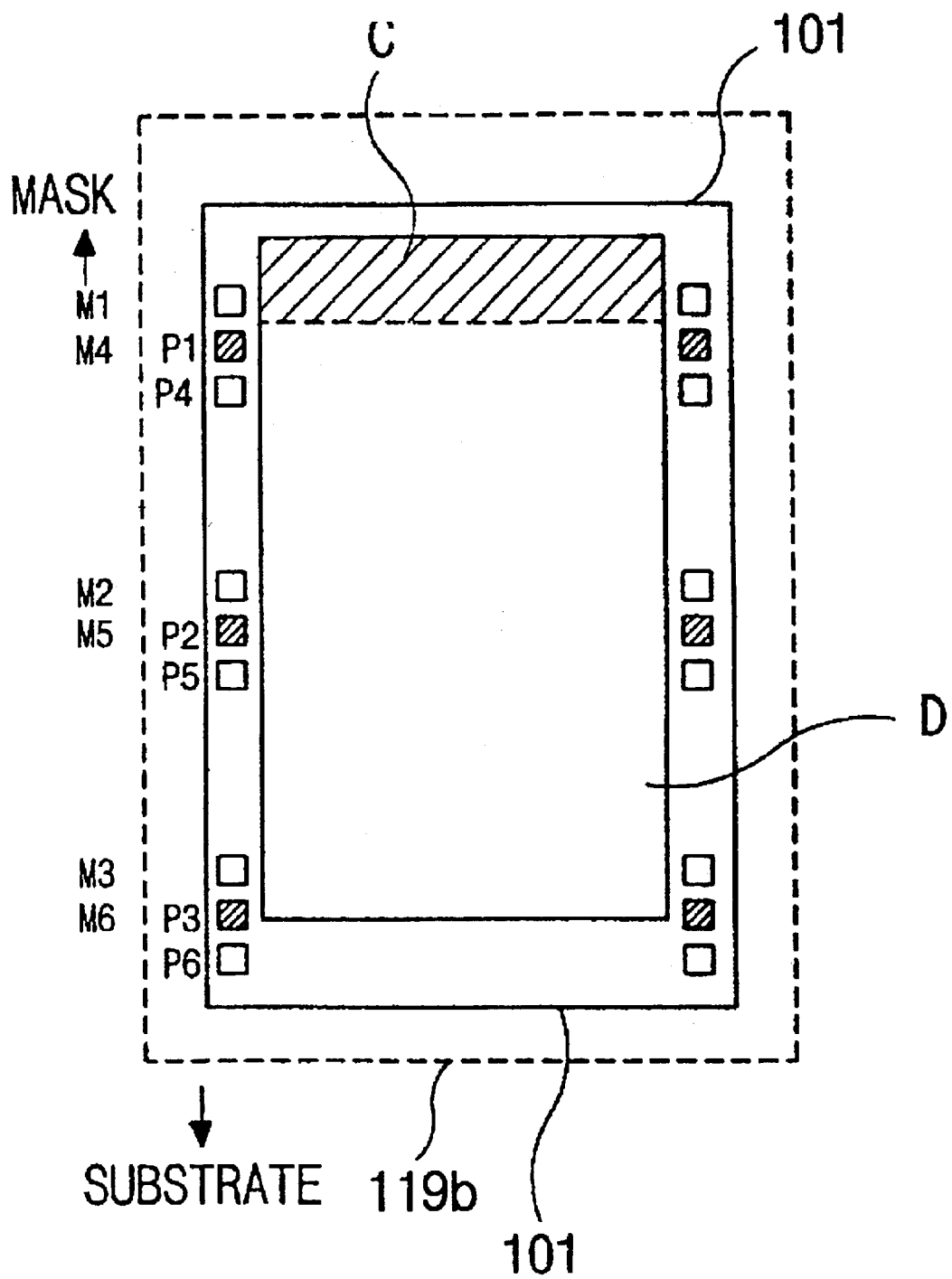

Next, as shown in FIG. 6B, the photomask 101 moves to the second sub-area 119b such that the photomask 101 aligns with a second exposing region "C". At this point, each auxiliary mask key (M4, M5, and M6) coincides with a corresponding main plate key (P1, P2, and P3) of the second sub-area 119b. Then, as shown in FIG. 6A, the first and second blades 115 and 117 adjust positions such that the first blade 115 covers most of the first sub-area 119a, while the second blade 117 covers the fourth exposing region "D" (the main pattern area) of the second sub-area 119b. Thereafter, the second sub-area 119b is exposed. The result is that only the second exposing region "C" is exposed to light.

Figure 7A:
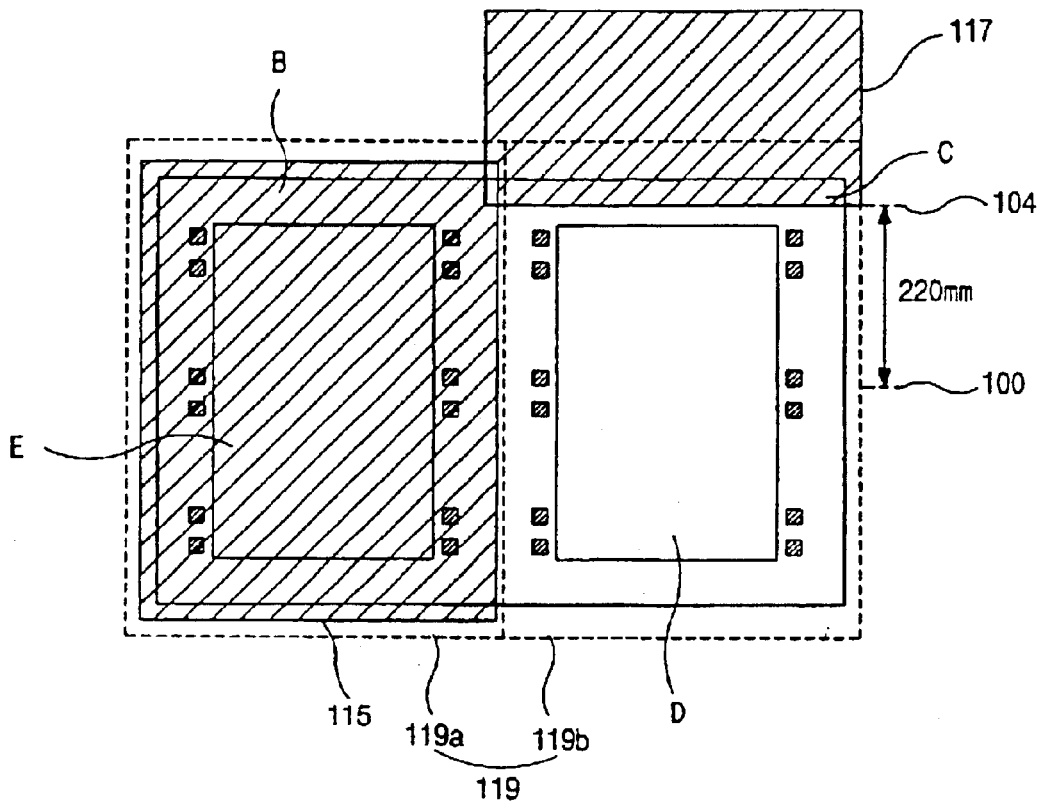
FIGS. 7A and 7B illustrate a third exposure according to the principles of the present invention.
Figure 7B:
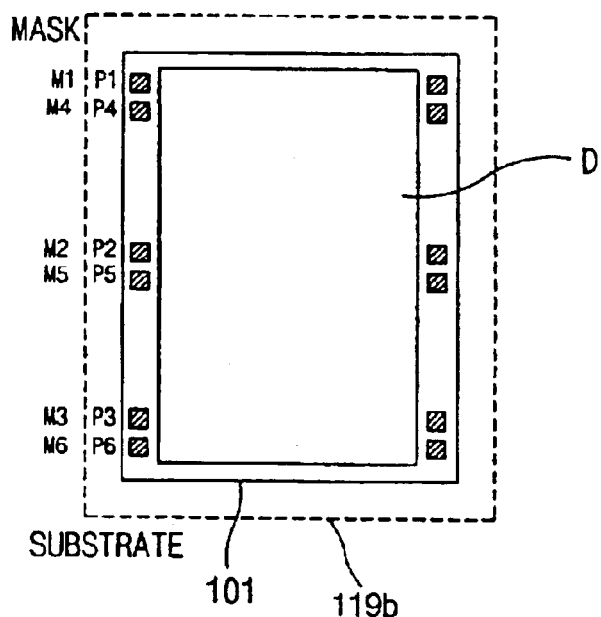

Next, as shown in FIG. 7B, the photomask 101 is aligned to the second sub-area 119b such that the fourth exposing region "D" of the second sub-area 119b is wholly covered by the photomask 101. At this point, each of the main mask key (M1, M2, and M3) coincides with a corresponding main plate key (P1, P2, and P3) of the second sub-area 119b, and each auxiliary mask key (M4, M5, and M6) coincides with a corresponding auxiliary plate key (P4, P5, and P6) of the second sub-area 119b. Namely, the photomask 101 moves down to cover the fourth exposing region "D". Thereafter, as shown in FIG. 7A, the first blade 115 moves to cover the first sub-area 119a while the second blade 117 moves to cover the second exposing region "C" of the second sub-area 119b. Thereafter, the second sub-area 119b is exposed. The result is that only the fourth exposing region "D" is exposed to light.

Figure 8A:
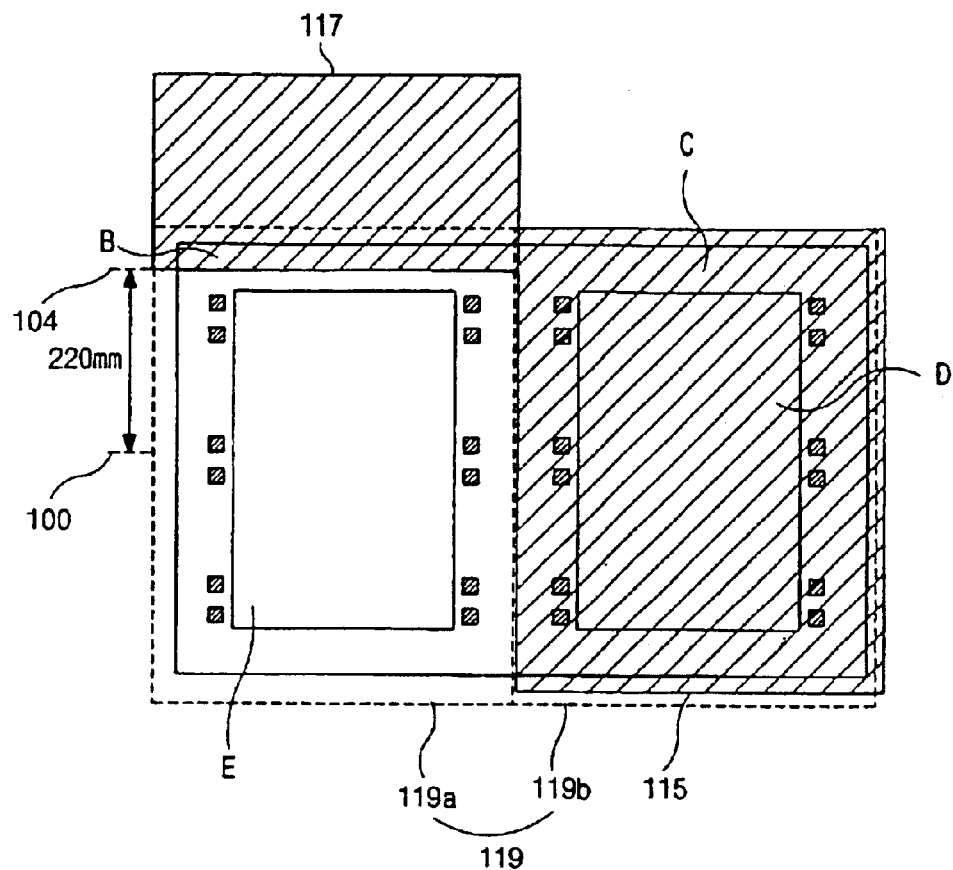
FIGS. 8A and 8B illustrate a fourth exposure according to the principles of the present invention.
Figure 8B:
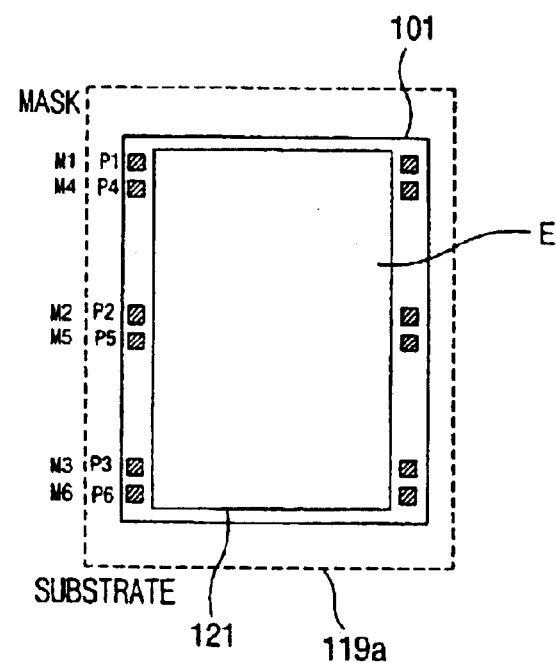

Next, as shown in FIG. 8B, the photomask 101 moves back to the first sub-area 119a and aligns such that the third exposing region "E" (the main pattern area) of the first sub-area 119a is covered by the photo-mask 101. At this point, each main mask key (M1, M2, and M3) coincides with a corresponding main plate key (P1, P2, and P3) of the first sub-area 119a, and each auxiliary mask key (M4, M5, and M6) coincides with a corresponding auxiliary plate key (P4, P5, and P6) of the first sub-area 119a. Then, as shown in FIG. 8A, the first and second blades 115 and 117 adjust positions such that the first blade 115 covers the second sub-area 119b, while the second blade 117 covers the first exposing region "B" of the first sub-area 119a. Thereafter, the first sub-area 119a is exposed. The result is that only the third exposing region "E" is exposed to light.

Accordingly, the overall surface of the substrate 119, which has an area of 670 mm×590 mm is exposed to light using a Canon™ aligner system (not shown) and the photomask 101.

Several features of the illustrated embodiment may require further amplification. First, in practice, only one of the two mask-bearing structures requires two sets of alignment keys. For example, the photomask might include only the auxiliary mask keys while the substrate would then have both the main plate keys and the auxiliary plate keys. Then, holding the photomask fixed, the substrate would be aligned such that the auxiliary mask keys and the main plate keys are aligned. Then, after exposure, the substrate could be moved such that the auxiliary mask keys and the auxiliary plate keys are aligned. All variations of the alignment keys, two sets on one structure and one set on the other structure, are within the principles of the present invention.

Second, the principles of the present invention are not limited to the particular dimensions described above. Nor is the particular exposure pattern significant. Third, the dimensions described above result in 5 mm borders around the substrate. Thus, it will be apparent to those skilled in the art that various modifications and variation can be made to the illustrated embodiment without departing from the spirit or scope of the invention. For example, in another embodiment, the alignment keys of the photomask and substrate may have a circular or semi-circular shape. Furthermore, the sequence of the overall exposing process may be changed. Thus, it is intended that the present invention covers all modifications and variations provided they come within the broad scope of the appended claims and their equivalents.

What is claimed is:

1. An array substrate, comprising:
    a substrate;
    a plurality of main plate keys on the substrate; and
    a plurality of auxiliary plate keys on the substrate, each auxiliary plate key being spaced apart by a predetermined distance from a corresponding main plate key;
    wherein said main plate keys and said auxiliary plate keys are dimensioned to align with mask keys on a photomask.

2. The array substrate according to claim 1, wherein the main plate keys are grouped into first, second, and third couples of alignment keys, with the individual main plate keys of each couple being on opposite sides of an exposing area of the photomask.

3. The array substrate according to claim 2, wherein each auxiliary plate key is spaced apart from its corresponding main plate key by 20 mm.

* * * * *